United States Patent [19]
Murata et al.

[11] Patent Number: 5,743,424
[45] Date of Patent: Apr. 28, 1998

[54] SEALABLE CONTAINER

[75] Inventors: Masanao Murata; Tsuyoshi Tanaka; Teruya Morita, all of Ise, Japan

[73] Assignee: Shinko Electric Co., Ltd., Tokyo, Japan

[21] Appl. No.: 582,727

[22] Filed: Jan. 4, 1996

[30] Foreign Application Priority Data

Jan. 9, 1995 [JP] Japan ................................. 7-018464

[51] Int. Cl.⁶ .............................................. B65D 51/16
[52] U.S. Cl. .......................... 220/203.13; 220/203.23; 220/203.29; 220/284; 220/323
[58] Field of Search ...................... 220/203.04, 203.07, 220/203.13, 210, 284, 323, 366.1, 373, 203.23, 203.29

[56] References Cited

U.S. PATENT DOCUMENTS

| 3,945,454 | 3/1976 | Kinoshita | 220/210 X |
| 4,579,244 | 4/1986 | Fukata | 220/210 |
| 5,000,339 | 3/1991 | Wheat et al. | 220/203 |
| 5,520,300 | 5/1996 | Griffin | 220/210 |

*Primary Examiner*—Stephen Cronin
*Attorney, Agent, or Firm*—Oblon, Spivak, McClelland, Maier & Neustadt, P.C.

[57] ABSTRACT

A sealable container for accommodating semiconductor wafers, which includes a hollow main body having an opening for receiving or removing the semiconductor wafers, a lid member for plugging the opening, a lock for locking and releasing the lid member in the opening of said main body, and a pressure-equalizing mechanism for allowing an interior portion of the main body to be communicable with an exterior portion thereof in cooperation with the lock.

4 Claims, 5 Drawing Sheets

SEALABLE CONTAINER

BACKGROUND OF THE INVENTION

1. Field of the Invention

The present invention relates to a sealable container for use in carrying semiconductor wafers in a clean room, and more particularly to a sealable container having a pressure-equalizing mechanism adapted to equalize pressures in the inside and outside of the sealable container when the sealable container is opened.

2. Discussion of the Background

It is most common to manufacture semiconductor devices in a purified atmosphere in a clean room. When semiconductor Wafers have to be carried from one process to another process in the clean room, the semiconductor Wafers are accommodated in a wafer cassette. The plurality of Wafer cassettes are placed in a portable container which is sealable with a lid member so as to prevent dust from collecting on the surfaces of the semiconductor wafers. In recent years, it is further contemplated that the atmosphere in the sealable container be replaced With inert gas such as nitrogen so as to prevent an oxide film from being formed by the natural oxidation of the semiconductor Wafers.

However, the prior art of the sealable container has one problem. For example, in case the container is sealed by the rotary movement of the cam member after heated semiconductor wafers are placed in the sealable container, when the temperature in the sealable container falls to a room temperature, the interior in the sealable container is placed under the influence of negative pressure which causes a difference of pressures between the inside and outside of the sealable container. As a result of, the lid member of the sealable container is sucked into the main body of the sealable container. So it is impossible to open the lid member even by the counter rotary movement of the cam member.

The same phenomenon as the lid member is sucked into the main body due to negative pressure in the sealable container also happens as a result of a change in atmospheric pressure.

SUMMARY OF THE INVENTION

In view of the above-described problems, the primary object of the invention is to provide a sealable container which can be easily opened by removal of a lid member and which can be kept airtight as long as the lid member engages the main body of the sealable container. In order to permit easy removal of the lid member, the sealable container in accordance with the present invention is provided with a pressure-equalizing mechanism for equalizing pressures between the interior and exterior of the sealable container.

The present invention is directed to a sealable container for accommodating semiconductor wafers, which comprises:

- a hollow main body having an opening for removing the semiconductor wafers therefrom or placing the wafers into;
- a lid member for plugging the opening;
- a lock means for locking and releasing the lid member in the opening of the main body; and
- a pressure-equalizing mechanism for keeping the interior of the main body airtight or allowing an interior in the main body to be communicated with the exterior thereof in cooperation with the lock means.

The pressure-equalizing mechanism opens or closes a vent hole provided in the lid member in cooperation with the lock means. The interior of the main body and the exterior thereof communicate via the vent hole.

The pressure-equalizing mechanism includes a valve for opening or closing the vent hole, which moves according to the deformation of a rocker arm caused by rotary movement of a cam member which is part of the lock means.

The mode of operation of the pressure-equalizing mechanism is determined by the mode of operation of the lock means so as to block the vent hole when the lock means is in its operative position and so as to allow the interior of the sealable container to be communicable with the exterior through the vent hole when the lock means is in its released position.

The valve comprises:

- a valve head slidably fitted in an enlarged recess which is enlarged continuously from the vent hole toward the rocker arm in the lid member;
- an annular seal arranged upon the valve head for sealing the vent hole;
- a valve rod extending vertically from the valve head on the opposite side to the annular seal with a smaller diameter than the valve head, which is integrated with the valve head and which extends slidably through an elongated slot longitudinally formed in the aforesaid rocker arm; and
- a pair of protuberant stoppers rigidly secured to the valve rod axially apart from each other by a prescribed distance so that the rocker arm may be interposed therebetween.

In another described embodiment, the valve consists of an elastic material such as rubber and is secured to the rocker arm in such a position as to conform to the position of the vent hole.

More specifically stated, the present invention comprises a pressure-equalizing mechanism adapted to cooperate with the lock means so as to keep the sealable container airtight or allow it to communicate with the exterior, whereby the pressure-equalizing mechanism blocks the vent bole provided in the lid member when the lock means is in its operative position, and the pressure-equalizing mechanism opens the vent hole when the lock means is in a released position.

Consequently, the sealable container in accordance with the present invention can be kept airtight when the lock means is in its operative position, and pressure existing in the inside and outside of the sealable container is equalized by opening the valve which has blocked the vent hole when the lock means is in the released position. Thus it will be seen that the pressure-equalizing mechanism substantially facilitates the removal of the lid member.

Moreover, the prior construction that has the lid member and the lock means is still useful since the present invention has the pressure-equalizing mechanism including the valve for opening or closing the vent hole according to the deformation of the rocker arm caused by the rotary movement of the cam member included in the lock means.

Thus, the prior sealable container can be easily remodeled without another complicate means different from the rocker arm for opening or closing the vent hole.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DESCRIPTION OF THE PREFERRED EMBODIMENTS

Embodiment 1

Now we will make reference to the accompanying drawings wherein a preferred embodiment of the present invention is clearly shown.

Figure 1:
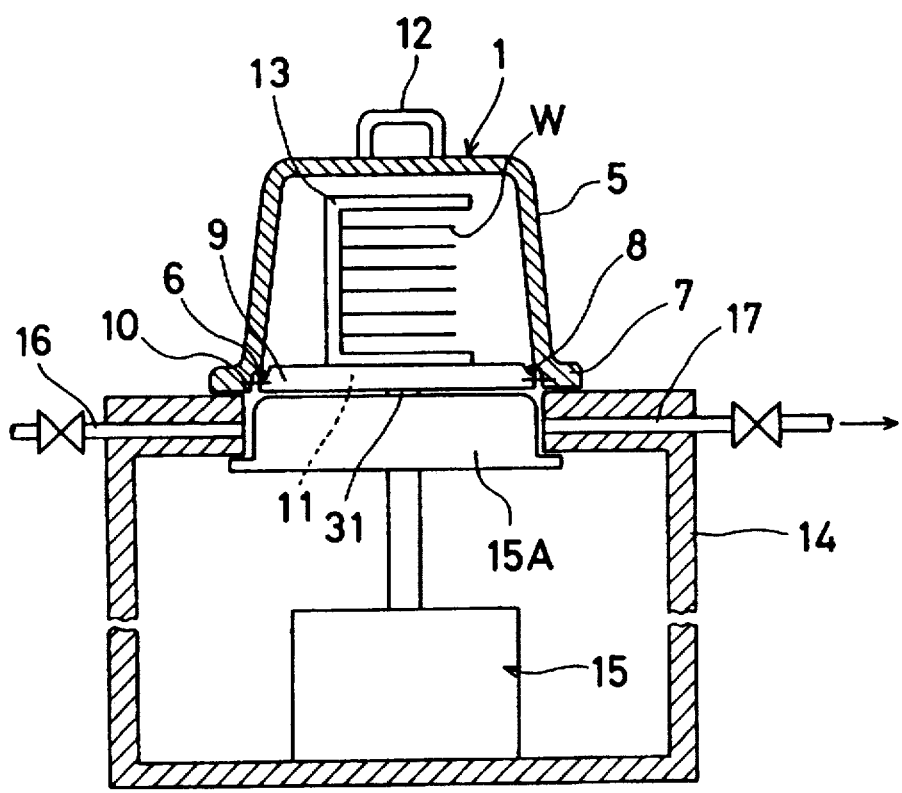
FIG. 1 is a vertical sectional view to help explain the structural construction of an embodiment of the present invention.

Referring now to FIG. 1, reference number 5 shows a hollow main body of the sealable container 1 which is a portable type. The hollow main body 5 of the sealable container 1 has an opening 6 and is formed with a peripheral flange 7. A lid member 9 is fitted into the opening 6 with annular seal 8. The lid member 9 has a cavity for accommodating a lock means 10 and a pressure-equalizing mechanism 11. Number 12 shows a hand-grip 12 on the upper end of the main body 5. Number 13 shows a wafer cassette 13 which accommodates a plurality of semiconductor wafers W and which is placed on the lid member 9 in the sealable container 1. Number 14 shows a gas purge box which has a lifting means 15 for lifting up or down a mounting bracket 15A and which is provided with pipes 16 and 17 preferably extending laterally in opposite directions through the wall of the upper part of the gas purge box 14. A gas tank, that will supply nitrogen or other inert gas under pressure, is connected to the pipe 16, and an exhaust pump is connected to the pipe 17.

Figure 2:
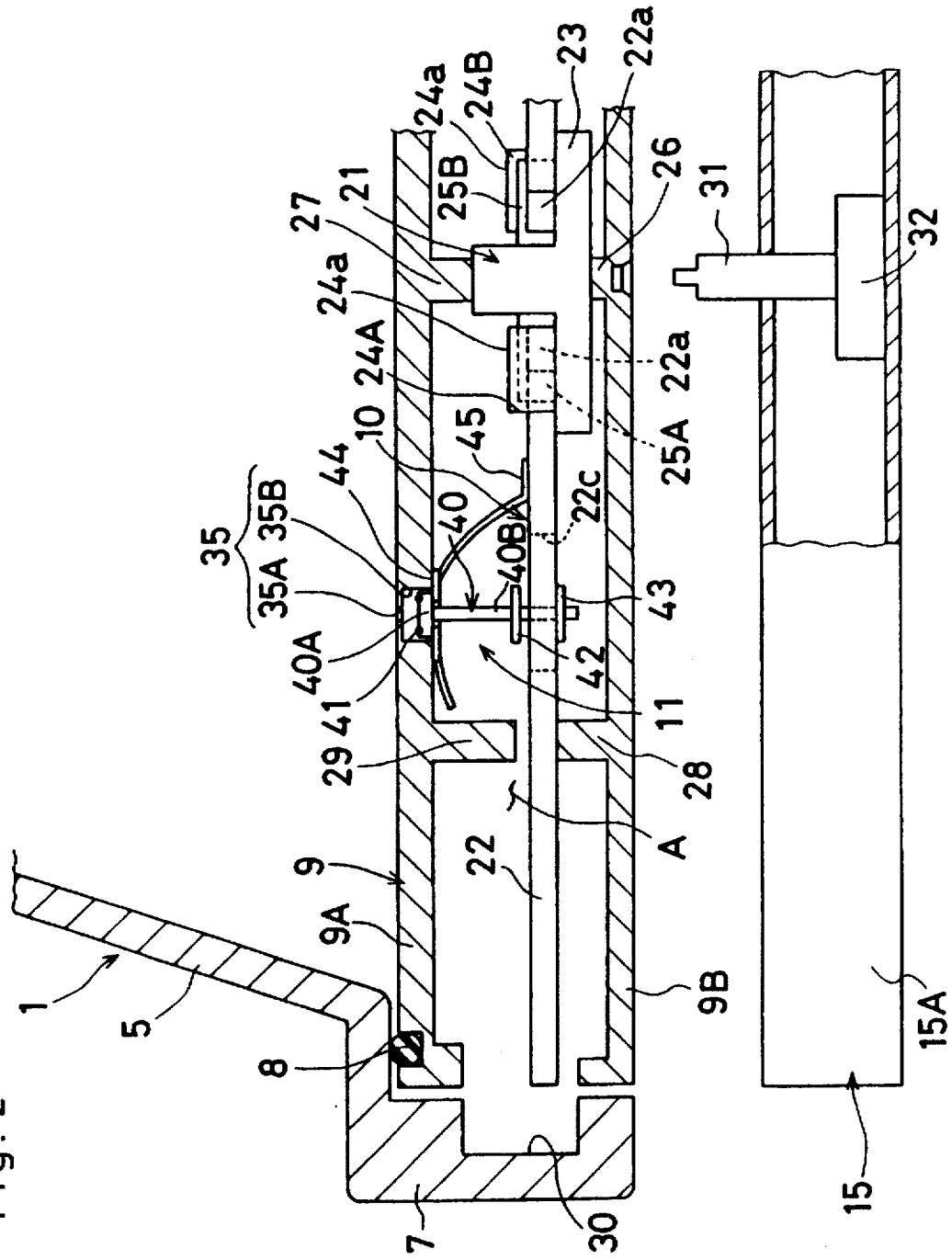
FIG. 2 is an enlarged fragmentary sectional elevation to help explain the structural construction of a lock means and a pressure-equalizing mechanism incorporated therein.
Figure 3:
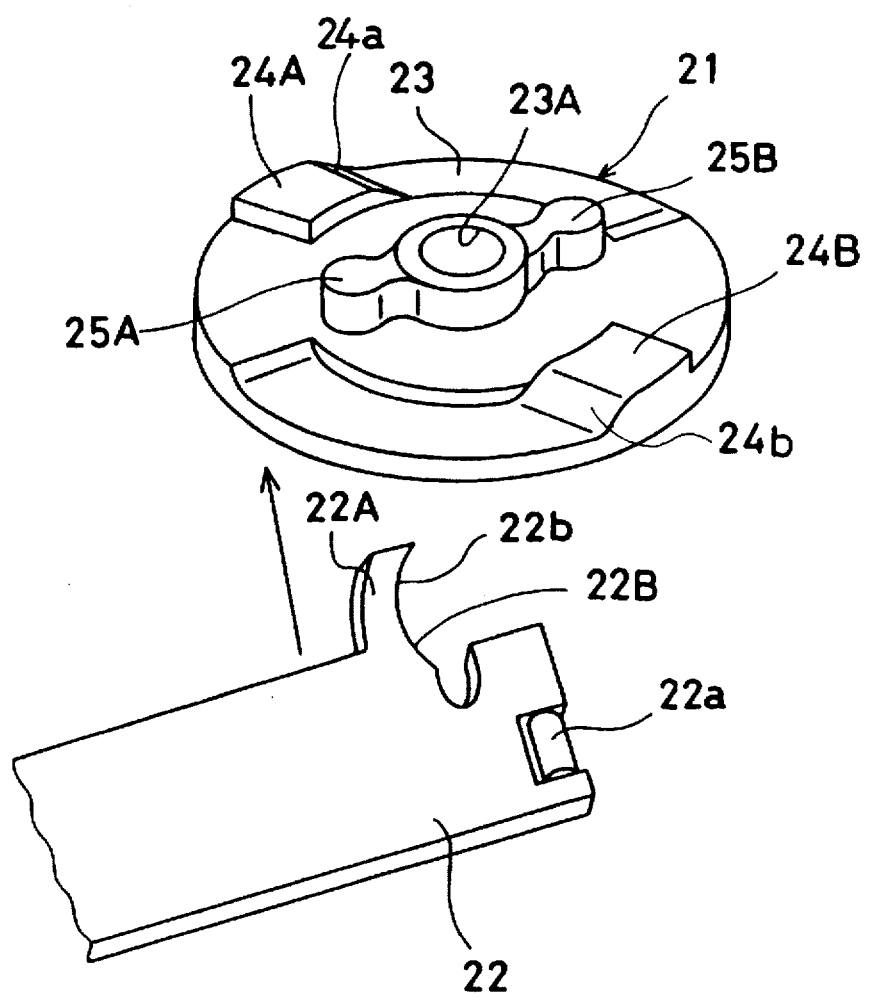
FIG. 3 is a perspective view to help explain the structural construction of a cam member and a rocker arm included in the lock means.

As shown in FIG. 2, the lid member 9 is hollow and is confined at the top by a top plate 9A and at the bottom by a bottom plate 9B so as to have a cavity A for accommodating the lock means 10 and the pressure-equalizing mechanism 11. The main parts of the lock means 10 are a cam member 21 and a pair of rocker arms 22, one of these two rocker arms 22 being omitted for the sake of simplicity. As shown in FIG. 3, the cam member 21 is a disc type such as a base member 23 having a center hole 23A and two diametrically opposed side protuberances 24A and 24B on its surface. The two protuberances 24A and 24B extend with a prescribed width alone its circumference of the base member and have inclined portions 24a and 24b respectively.

A pair of diametrically opposed projections 25A and 25B are arranged at a right angle to the protuberances 24A and 24B. Each of the projections 25A and 25B has an oval shape from a top view. As shown in FIG. 2, the cam member 21 is rotatably disposed between the bottom plate 9B and the top plate 9A by means of pins 26 and 27 so as to face the surface of the cam member 21 provided with the protuberance 24A, 24B with the top plate 9A. The means of pins 26 are protruded from center of the bottom plate 9B to the cavity A. The means of pins 27 are protruded from center of the top plate 9A to the cavity A.

The rocker arm 22 is a plate type of one accommodated in the cavity A of the lid member 9 and carries a roller 22a on one end (opposite side to the peripheral flange 7). As shown in FIG. 3, the rocker arm 22 has a guide element 22A protruded from the rocker arm 22 in the same direction as an axis of the roller 22a.

A groove 22B is formed in the gide element 22A, the contour of which is suitable for engagement with the projections 25A and 25B. The roller 22a is allowed to ride on either of the protuberances 24A or 24B when either of the projections 25A or 25B has been engaged with the groove 22B. Thus, as shown in FIG. 2, the rocker arm 22 has a cantilever state by the engagement with the projections 25A or 25B on the com member 2 while the rocker arm 22 at a vicinity of center is regulated so as to kept straight in the cavity A by a lower regulation member 28 carried by the inner surface of the bottom plate 9B. Upon rotating of the cam member 21, the projection 25A or 25B moves along the surface 22b of the groove 22B and thereby allows the rocker arm 22 to move longitudinally. Then the other end of the rocker arm 22 will engage in the groove 30. Further, when the roller 22a of the cam member 21 rotates on the either inclined portion 24a or 24b of the protuberance 24A or 24B, the rocker arm 22 inclines. Number 29 shows a upper regulation member integrally carried by the inner surface of the top plate 9A and facing to the lower regulation member 28. Number 30 shows the groove 30 which opens along the inner surface of the peripheral flange 7 of the sealable container 1. The aforesaid other end of the rocker arm 22 engages in the groove 30. A cam shaft 31 is carried by the mounting bracket 15A of the lifting means 15, which extends to the sealable container 1.

The cam shaft 31 is connected to the cam member 21 with a spline when the lit member 9 is installed on the mounting bracket 15A. The mounting bracket 15A accommodates a drive means 32 for rotating the cam member 21 by a prescribed angle.

Figure 4:
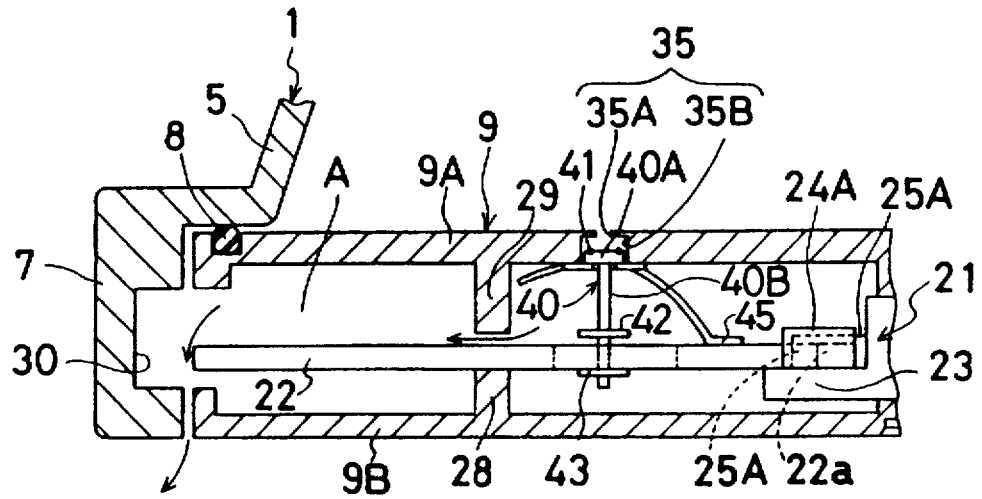
FIGS. 4(a) to 4(c) are enlarged fragmentary sectional elevational views to help explain the operation of the pressure:equalizing mechanism.
Figure 4:
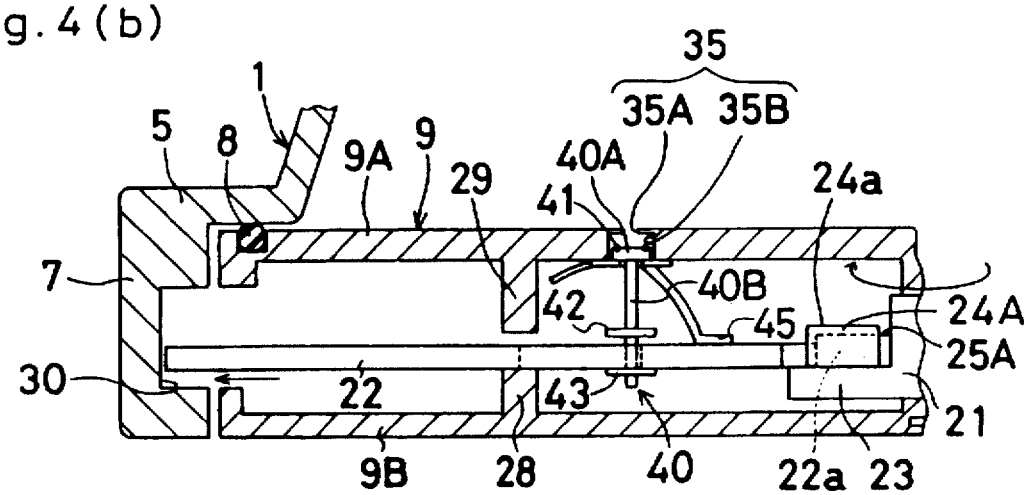
Figure 4:
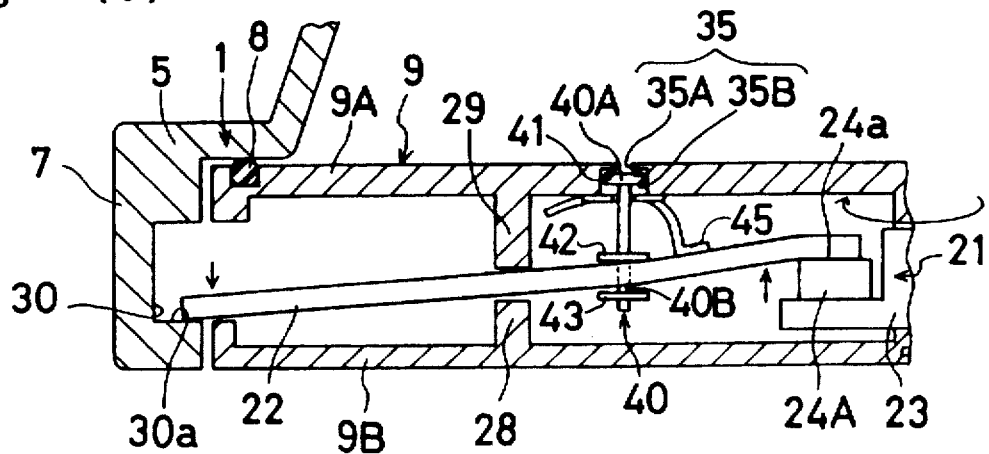

The main parts of the pressure-equalizing mechanism 11 are a vent hole 35 provided in the top plate 9A and a valve 40 adapted to mask the vent hole 35. The vent hole 35 consists of a bore 35A and a larger bore 35B axially and continuously aligned so as to form a shoulder defined at the intersection of the bore 35A and the larger bore 35B. The bore 35A opens toward an inner space of the sealable container 1. The larger bore 35B opens on toward the cavity A of the lid member 9, of which diameter is larger than the bore 35A. A valve head 40A of the valve 40 is slidably fitted in the larger bore 35B. An annular seal 41 is arranged upon the valve head 40A for sealing the vent hole 35. A valve rod 40B is integrally formed with the valve head 40A at the opposite side to the annular seal 41, of which diameter is smaller than the valve head 40A. The valve red 40B extends toward the bottom plate through an elongated slot 22c in the rocker arm 22, where the valve rod 40B is slidable in the elongated slot 22c. The elongated slot 22c is longitudinally formed in the rocker arm 22. And a pair of protuberant stoppers 42 and 43 are rigidly secured to the valve rod 40B axially apart from each other by a prescribed distance so that the rocker arm 22 may be interposed therebetween. The stopper 43 touches to the under surface of the rocker arm 22 in FIG. 2, 4(a) or 4(b). A plate type member 44 in FIG. 2 is secured to the under surface of the top plate 9A over the larger bore 35B, which has a center hole such that valve rod 40B may pass through, and the downward movement of the valve head 40A may be limited thereby. A flat spring 45 is secured on the upper surface of the rocker arm 22 at one end side.

There shall now be described one utilization of this embodiment in connection with FIGS. 4(a) to 4(c). Presuming at the beginning of the operation that, the lock means 10 is in its released position and the valve 40 is open as shown in FIG. 4(a), the interior of the sealable container 1 is in communication with the exterior through the cavity A of the lid member 9.

To begin with, the atmosphere in the sealable container 1 accommodating a plurality of semiconductor wafers W is replaced with inert gas (such as nitrogen). Such is not always the case with the atmosphere in the sealable container 1. There is for example one case where the atmosphere in the sealable container 1 is kept in a purified atmosphere without being replaced with inert gas.

In order to carry or store these semiconductor wafers W, the lid member 9 engages with the main body 5 of the sealable container 1. In order to make the sealable container 1 airtight, the cam member 21 is rotated through a prescribed angle in FIG. 4(a). Then the projection 25A or 25B moves along the surface 22b of the groove 22B as shown in FIG. 3, and thereby the rocker arm 22 is moved in horizontal direction. Then, as shown in FIG. 4(b), the other end of the rocker arm 22 will engage in the groove 30 formed in the peripheral flange 7. During this movement of the rocker arm 22 into the groove 30, the flat spring 45 yieldingly maintains the rocker arm 22 in a substantially horizontal position by placing the rocker arm 22 on the lower regulation member 28. By virtue of this flat spring 45, the movement of the rocker arm 22 into the groove 30 will not be hindered by the edge of the groove 30. Its center of gravity in the rocker arm 22 moves toward the groove 30 together with the further movement of the rocker arm 22 into the groove 30. Thus the rocker arm 22 comes to be pivotable in a counterclockwise direction about the lower regulation member 28 against the force of the flat spring 45.

Upon further rotary movement of the cam member 21, the roller 22a rotates upward on the either inclined surface 24a or 24b of the protuberance 24A or 24B, as already described with reference to FIG. 3. The rocker arm 22 rises up toward the top plate 9A and deforms around the upper regulation member 29 as a fulcrum. Consequently, one end of the rocker arm 22 provided with the roller 22a is forced upward while the other end of the rocker arm 22 abuts against the bottom face 30a of the groove 30 as shown in FIG. 4(c). A force at the other end of the rocker arm 22 caused by this deformation urges the main body 5 of the sealable container 1 to move toward the bottom plate 9B. As a result of that, a tight engagement between the main body 5 and the top plate 9A with the annular seal 8 interposed therebetween is achieved. Thus the lock means 10 has been brought into an locking position. On the other hand, one end of the rocker arm 22 has abuted against the stopper 42 of the valve 40 and thereby the valve 40 rises toward the top plate 9A. At last, the annular seal 41 arranged upon the valve head 40A abuts against the shoulder defined at the intersection of the bore 35A and the larger bore 35B so as to close airtightly the bore 35A. As a result of that, the interior of the sealable container 1 is intercepted from the exterior and an airtightness of the sealable container 1 is achieved.

When the sealable container 1 is opened by removal of the lid member 9, the cam member 21 is driven in the counter direction. Thereby, the roller 22a rotates downward on the inclined surface 24a or 24b of the protuberance 24A or 24B and removes the deformation from the rocker arm 22. The one end of the rocker arm 22 provided with the roller 22a moves towards the bottom plate 9B as shown FIG. 4(b) so as to be restored. And then the rocker arm 22 is placed again on the lower regulation member 28. When the cam member 21 further rotates, the projection 25A or 25B moves along the surface 22b of the groove 22B. And then the other end of the rocker arm 22 is disengaged from the groove 30. In the meanwhile the rocker arm 22 abuts against the stopper 43 of the valve 40 and the valve 40 is moved toward the bottom plate 9B by the downward movement of the valve 40. As a result of that, the bore 35A opens and the interior of the sealable container 1 is communicable with the exterior through the bore 35A, cavity A in the lid member and a gap between the bottom plate 9B and the peripheral flange 7. Consequently, a pressure of the interior in the sealable container 1 and a pressure of the exterior (atmospheric pressure) are instantly equalized. After that, the lid member 9 is removed from the main body 5 of the sealable container 1 and semiconductor wafers W are taken out the sealable container 1.

Embodiment 2

Figure 5:
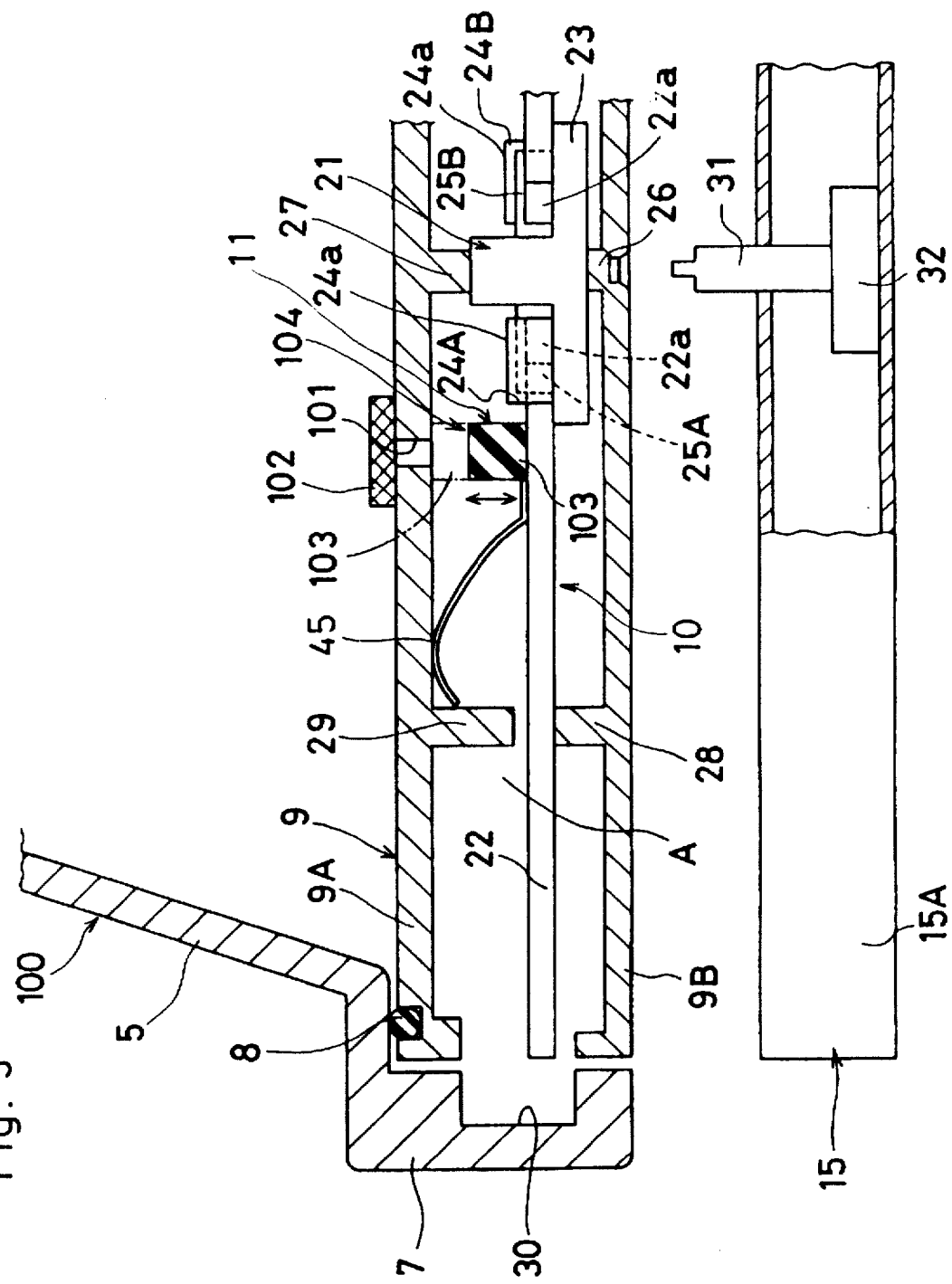
FIG. 5 is an enlarged fragmentary sectional elevational views to help explain the structural construction of a further type of the pressure-equalizing mechanism.

Now will be made reference to another embodiment of the present invention. FIG. 5 is an enlarged fragmentary sectional elevation to help explain the structural construction of this embodiment. The same reference numbers in FIG. 5 appears as in FIG. 1 to FIG. 4(c) indicate the same parts.

A pressure-equalizing mechanism 104 incorporated in a sealable container 100 shown in FIG. 5 is a modification of the pressure-equalizing mechanism 11 incorporated in the sealable container 1. Reference number 101 shows a vent hole 101 provided in the vicinity of center of the top plate 9A (i.e. in the vicinity of the cam member 21). The vent hole 101 opens through the top plate 9A toward both of the interior of the sealable container 100 and the cavity A in the lid member 9. A filter 102 covers the vent hole 101 on an interior side of the sealable container 100. Reference number 103 shows a valve which is a member of a pressure-equalizing mechanism 104, which consists of an elastic material (such as rubber), and which is fixed on the rocker arm 22 in such a position so as to correspond to the position of the vent hole 101. The valve can closes the vent hole 101 due to its resilience.

There shall now be described the operation of this embodiment 2 which has the above construction. The lack means 10 will need no further description since its action is identical with the embodiment 1 hereinabove described in connection with FIGS. 4(a) to 4(c). Therefore, especially detailed description will cover the action of the pressure-equalizing mechanism 104.

Semiconductor wafers W in the sealable container 100 are carried or stored after the atmosphere in the sealable container 100 is replaced with inert gas (such as nitrogen) by a gas purge box. Thus is not always the case with the atmosphere in the sealable container 100. There is one case where the atmosphere in the sealable container 100 is kept in a purified atmosphere without replaced with inert gas.

In order to make the sealable container 100 airtight after the lid member 9 engages the main body 5 of the sealable container 100, the cam member 21 is rotated through a prescribed angle so that the rocker arm 22 may move longitudinally towards the groove 30. After the rocker arm 22 moves longitudinally towards the groove 30, the rocker arm 22 is deformed on the upper regulation member 29 as a fulcrum so that the other end of the rocker arm 22 may abut against the bottom face 30a of the groove 30. The main body 5 of the sealable container 100 is urged to move toward the bottom plate 9B by this deformation of the rocker arm 22.

As a result, tight engagement between the main body 5 and the top plate 9A with the annular seal 8 interposed therebetween is achieved and the lock means 10 is brought into an operative position.

On the other hand, the valve 103 rises toward the top plate 9A by the rocker arm 22 at one end side connected with the com member 21. Finally, the valve 103 closes airtightly the vent hole 101 with its resilience. As a result, the interior of the sealable container 100 is blocked from the exterior and an airtightness of the sealable container 100 is achieved.

When the sealable container 100 is opened by removal of the lid member 9, the cam member 21 is driven in a counter direction. Thereby, the deformation is removed from the rocker arm 22. And then the rocker arm 22 is restored and placed again on the lower regulation member 28. The other end of the rocker arm 22 is disengaged from the groove 30.

In the meantime, the valve 103 of the pressure-equalizing mechanism 104 is moved toward the bottom plate 9B by the downward movement of the rocker arm 22.

As a result, the vent hole 101 opens and the interior of the sealable container 100 is communicable with the exterior through the vent hole 101, cavity A in the lid member 9 and a gap between the bottom plate 9B and the peripheral flange 7. Consequently, the pressure of the interior in the sealable container 1 and a pressure of the exterior (atmospheric pressure) are instantly equalized. After that, the lid member 9 is removed from the main body 5 of the sealable container 100 and semiconductor wafers W are taken out the sealable container 100.

In addition, each of embodiments 1 and 2 show the container wherein the valves 40 and 103 of the pressure-equalizing mechanism are moved vertically by the movement of the rocker arm 22 in order to open and close the vent hole. The rocker arm 22 is moved by the horizontally rotary motion of the com member 21. Instead of the above valves 40 and 103, a valve may be utilized which is moved by a crank mechanism for converting the horizontally rotary motion of the cam member 21 into the vertical motion.

The sealable container in accordance with the present invention is especially suited for use in accommodating semiconductor wafers, because this sealable container can be easily opened by a pressure-equalizing mechanism for equalizing pressures in the inside and out side of the sealable container when removing the lid member from the main body of the sealable container and further this sealable container can be kept airtight as long as the lid member engages the main body of the sealable container.

What is claimed is:

1. A sealable container for accommodating semiconductor wafers, which comprises:
   a hollow main body having an opening for insertion or removal of the semiconductor wafers,
   a lid member plugging said opening, said lid member having a vent hole formed therein communicating an interior portion of said main body with an exterior thereof,
   lock means including a cam member and a rocker arm moveable by rotary movement of the cam member, said rocker arm locking and releasing said lid member in said opening of said main body,
   a pressure-equalizing mechanism allowing an interior portion of said main body to be communicable with an exterior portion thereof, said pressure-equalizing mechanism having a valve opening or closing said vent hole, wherein said valve comprises:
      a valve head slidably fitted in a recess which communicates with said vent hole in said lid member and which has a diameter larger than that of said vent hole,
      an annular seal arranged on said valve head, said annular seal sealing said vent hole,
      a valve rod extending vertically from said valve head on an opposite side of said annular seal with a smaller diameter than that of said valve head, said valve rod being connected with said valve head and slidably extending through an elongated slot longitudinally formed in said rocker arm, and
      a pair of protuberant stoppers rigidly secured to said valve rod axially apart from each other a distance such that said rocker arm is interposed therebetween.

2. A sealable container for accommodating semiconductor wafers, which comprises:
   a hollow main body having an opening for insertion and removal of the semiconductor wafers,
   a lid member plugging said opening, said lid member having a vent hole formed therein communicating with an interior portion of said main body and an exterior portion thereof,
   lock means including a cam member and a rocker arm moveable in both horizontal and vertical directions upon rotary movement of the cam member, said rocker arm locking and releasing said lid member in said opening of said main body,
   a pressure-equalizing mechanism allowing the interior portion of said main body to be communicable with the exterior portion thereof, said pressure-equalizing mechanism including a valve opening or closing said vent hole, said valve including an elastic material mad being secured to said rocker arm in such a position as to conform to said position of said vent hole upon movement of the rocker arm.

3. A sealable container for accommodating semiconductor wafers, which comprises:
   a hollow main body having an opening for insertion or removal of the semiconductor wafers,
   a lid member plugging said opening, said lid member having a vent hole formed therein communicating an interior portion of said main body with an exterior thereof,
   lock including a cam member and a rocker arm moveable by rotary movement of the cam member, said rocker arm locking and releasing said lid member in said opening of said main body,
   a pressure-equalizing mechanism allowing an interior in a portion of said main body to be communicable with an exterior portion thereof, said pressure-equalizing mechanism having a valve opening or closing said vent hole, wherein said valve comprises:
      a valve head slidably fitted in a recess which communicates with said vent hole in said lid member and which has a diameter larger than that of said vent hole,
      an annular seal arranged on said valve head, said annular seal sealing said vent hole,
      a valve rod extending vertically from said valve head on an opposite side of said annular seal with a smaller diameter than that of said valve head, said valve rod being connected with said valve head and slidably extending through an elongated slot longitudinally formed in said rocker arm, and
      a pair of protuberant stoppers rigidly secured to said valve rod axially apart from each other a distance such that said rocker arm is interposed therebetween.

4. A sealable container for accommodating semiconductor wafers, which comprises:

- a hollow main body having an opening for insertion and removal of the semiconductor wafers,
- a lid member plugging said opening, said lid member having a vent hole formed therein communicating with an interior portion of said main body and an exterior portion thereof,
- a lock which includes a cam member and a rocker arm moveable in both horizontal and vertical directions upon rotary movement of the cam member, said rocker arm locking and releasing said lid member in said opening of said main body,
- a pressure-equalizing mechanism allowing the interior portion of said main body to be communicable with the exterior portion thereof, said pressure-equalizing mechanism including a valve opening or closing said vent hole, said valve including an elastic material and being secured to said rocker arm in such a position as to conform to said position of said vent hole upon movement of the rocker arm.

* * * * *